United States Patent
Resnick

(10) Patent No.: US 9,959,929 B2
(45) Date of Patent: May 1, 2018

(54) MEMORY DEVICE AND METHOD HAVING ON-BOARD PROCESSING LOGIC FOR FACILITATING INTERFACE WITH MULTIPLE PROCESSORS, AND COMPUTER SYSTEM USING SAME

(71) Applicant: MICRON TECHNOLOGY, INC., Boise, ID (US)

(72) Inventor: David Resnick, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days. days.

(21) Appl. No.: 14/609,963

(22) Filed: Jan. 30, 2015

(65) Prior Publication Data

US 2015/0143040 A1     May 21, 2015

Related U.S. Application Data

(63) Continuation of application No. 13/243,917, filed on Sep. 23, 2011, now Pat. No. 8,977,822, which is a
(Continued)

(51) Int. Cl.
    *G06F 12/00*        (2006.01)
    *G11C 14/00*        (2006.01)
(Continued)

(52) U.S. Cl.
    CPC ...... *G11C 14/0018* (2013.01); *G06F 12/0246* (2013.01); *G11C 7/1006* (2013.01);
(Continued)

(58) Field of Classification Search
    CPC .......... G11C 7/1006; G11C 2207/2245; G06F 12/0246; G06F 2212/7207
(Continued)

(56) References Cited

U.S. PATENT DOCUMENTS 4,787,041 A    11/1988   Yount
4,789,925 A    12/1988   Lahti
(Continued)

FOREIGN PATENT DOCUMENTS

EP        0718769      6/1996
TW       5978915     11/1999
(Continued)

OTHER PUBLICATIONS

First Office Action received for TW application No. 097130579, Oct. 30, 2012.
(Continued)

*Primary Examiner* — Mardochee Chery
(74) *Attorney, Agent, or Firm* — Dorsey & Whitney LLP

(57) ABSTRACT

A memory device includes an on-board processing system that facilitates the ability of the memory device to interface with a plurality of processors operating in a parallel processing manner. The processing system includes circuitry that performs processing functions on data stored in the memory device in an indivisible manner. More particularly, the system reads data from a bank of memory cells or cache memory, performs a logic function on the data to produce results data, and writes the results data back to the bank or the cache memory. The logic function may be a Boolean logic function or some other logic function.

20 Claims, 3 Drawing Sheets

Related U.S. Application Data continuation of application No. 11/893,593, filed on Aug. 15, 2007, now Pat. No. 8,055,852.

(51) Int. Cl.
  *G11C 7/10* (2006.01)
  *G06F 12/02* (2006.01)
  *G11C 16/04* (2006.01)

(52) U.S. Cl.
  CPC .. *G06F 2212/7207* (2013.01); *G11C 16/0408* (2013.01); *G11C 2207/2245* (2013.01)

(58) Field of Classification Search
  USPC .................. 711/105, 154, 104, 5, 147, 118
  See application file for complete search history.

(56) References Cited

U.S. PATENT DOCUMENTS

| | | |
|---|---|---|
| 4,796,232 A | 1/1989 | House |
| 4,873,630 A | 10/1989 | Rusterholz et al. |
| 4,975,878 A | 12/1990 | Boddu et al. |
| 5,067,071 A | 11/1991 | Schanin et al. |
| 5,163,139 A | 11/1992 | Haigh et al. |
| 5,420,994 A | 5/1995 | King et al. |
| 5,457,482 A | 10/1995 | Rhoden et al. |
| 5,488,583 A | 1/1996 | Ong et al. |
| 5,524,225 A | 6/1996 | Kranich |
| 5,678,021 A | 10/1997 | Pawate et al. |
| 5,682,344 A | 10/1997 | Seyyedy |
| 5,737,757 A | 4/1998 | Hassoun et al. |
| 5,802,541 A | 9/1998 | Reed |
| 5,835,925 A | 11/1998 | Kessler et al. |
| 5,907,861 A | 5/1999 | Seyyedy |
| 5,978,915 A | 11/1999 | Lisart |
| 6,026,478 A | 2/2000 | Dowling |
| 6,049,487 A | 4/2000 | Plants et al. |
| 6,081,876 A | 6/2000 | Brewer et al. |
| 6,321,314 B1 | 11/2001 | Van Dyke |
| 6,343,346 B1 | 1/2002 | Olnowich |
| 6,378,049 B1 | 4/2002 | Stracovsky et al. |
| 6,563,754 B1 | 5/2003 | Lien et al. |
| 6,611,904 B1 | 8/2003 | Uguen |
| 6,868,019 B2 | 3/2005 | Mohr et al. |
| 7,082,075 B2 | 7/2006 | Skuidmore |
| 7,174,429 B2 | 2/2007 | Revilla et al. |
| 7,203,791 B2 | 4/2007 | Lee et al. |
| 7,209,405 B2 | 4/2007 | Jeddeloh |
| 7,320,100 B2 | 1/2008 | Dixon et al. |
| 7,421,564 B1 | 9/2008 | Rahim et al. |
| 7,565,593 B2 | 7/2009 | Dixon et al. |
| 7,574,576 B2 | 8/2009 | Kato et al. |
| 7,676,728 B2 | 3/2010 | Resnick et al. |
| 7,822,911 B2 | 10/2010 | Resnick |
| 8,055,852 B2 | 11/2011 | Resnick |
| 8,291,174 B2 | 10/2012 | Resnick |
| 2003/0018860 A1 | 1/2003 | Krueger |
| 2003/0056143 A1 | 3/2003 | Prabhu |
| 2003/0221091 A1 | 11/2003 | Henry et al. |
| 2004/0093458 A1 | 5/2004 | Kanno et al. |
| 2004/0093467 A1 | 5/2004 | Shen et al. |
| 2004/0193837 A1 | 9/2004 | Devaney |
| 2004/0202034 A1 | 10/2004 | Lee |
| 2005/0022065 A1* | 1/2005 | Dixon .................. G06F 11/106 714/42 |
| 2005/0097276 A1 | 5/2005 | Lu et al. |
| 2005/0144375 A1 | 6/2005 | Bains et al. |
| 2005/0207257 A1 | 9/2005 | Skidmore |
| 2005/0219901 A1 | 10/2005 | Gilton |
| 2006/0047886 A1 | 3/2006 | Leaback |
| 2006/0190671 A1 | 8/2006 | Jeddeloh |
| 2006/0274577 A1 | 12/2006 | Pascucci et al. |
| 2007/0067556 A1 | 3/2007 | Dixon et al. |
| 2007/0091707 A1 | 4/2007 | Hidaka |
| 2007/0101238 A1 | 5/2007 | Resnick et al. |
| 2007/0113150 A1 | 5/2007 | Resnick et al. |
| 2007/0150671 A1 | 6/2007 | Kurland |
| 2008/0155217 A1 | 6/2008 | Kato et al. |
| 2008/0183984 A1 | 7/2008 | Beucler et al. |
| 2008/0189557 A1 | 8/2008 | Pipitone et al. |
| 2009/0006800 A1 | 1/2009 | Bellofatto et al. |
| 2009/0049245 A1 | 2/2009 | Resnick |
| 2009/0049250 A1 | 2/2009 | Resnick |
| 2009/0049264 A1 | 2/2009 | Resnick |
| 2009/0138675 A1 | 5/2009 | Marr et al. |
| 2009/0138680 A1 | 5/2009 | Johnson et al. |
| 2009/0138687 A1 | 5/2009 | Kang |
| 2011/0029712 A1 | 2/2011 | Resnick |
| 2011/0119467 A1 | 5/2011 | Cadambi et al. |
| 2011/0191548 A1 | 8/2011 | Miller et al. |
| 2012/0023294 A1 | 1/2012 | Resnick |
| 2012/0072675 A1 | 3/2012 | Moyer |
| 2012/0102275 A1 | 4/2012 | Resnick |
| 2013/0013876 A1 | 1/2013 | Resnick |

FOREIGN PATENT DOCUMENTS

| | | |
|---|---|---|
| TW | 200635383 | 10/2006 |
| TW | 7174429 B2 | 2/2007 |
| TW | 200729859 | 8/2007 |

OTHER PUBLICATIONS

International Search Report and Written Opinion in International Application No. PCT/US2008/072809, dated Feb. 26, 2009.
IEEE 100 The Authoritative Dictionary of IEEE Standard Terms, IEEE, Seventh Ed., Dec. 2000, pp. 787-788.
Office Action of the Intellectual Property Office for TW Appl. No. 097130579 dated Oct. 15, 2014.
Fang, et al., "Active Memory Operations", ACM, Jun. 2007, 232-241.
Resnick, et al., TW Office Action for Taiwan Application No. 097130579 dated Apr. 3, 2013.
"Application Note: Accelerate Common GUI Operations With a TPDRAM-Based Frame Buffer; AN-43-01 Accelerate GUI Operations; Application Note: Use of TPDRAM for Smarter/Faster Network Applications, AN-43-02 TPDRAM for Network Applications", Micron Semiconductor, Inc. (1994), Retrieved Feb. 2010, pp. 6-75 through 6-90.

* cited by examiner

MEMORY DEVICE AND METHOD HAVING ON-BOARD PROCESSING LOGIC FOR FACILITATING INTERFACE WITH MULTIPLE PROCESSORS, AND COMPUTER SYSTEM USING SAME

CROSS-REFERENCE TO RELATED APPLICATION

This application is a continuation of U.S. patent application Ser. No. 13/243,917, filed Sep. 23, 2011, issued as U.S. Pat. No. 8,977,822 on Mar. 10, 2015, which is a continuation of U.S. patent application Ser. No. 11/893,593, filed Aug. 15, 2007 and issued as U.S. Pat. No. 8,055,852 on Nov. 8, 2011. These applications and patents are incorporated herein by reference in their entirety, for any purpose.

TECHNICAL FIELD

This invention relates generally to memory devices, and, more particularly, to a memory device and method that facilitates access by multiple memory access devices, as well as memory systems and computer systems using the memory devices.

BACKGROUND

As computer and computer system architecture continues to evolve, the number of processing cores and threads within cores is increasing geometrically. This geometric increase is expected to continue, even for simple, relatively inexpensive computer systems. For server systems, system sizes measured in the number of processors are increasing at an even faster rate.

Although this rapid increase in the number of cores and threads enhances the performance of computer systems, it also has the effect of making it difficult to apply the increasing parallelism to single applications. This limitation exists even for high-end processing tasks that naturally lend themselves to parallel processing, such as, for example, weather prediction. One of the major reasons for this limitation is that the number of communication paths between processors, cores, and threads increases disproportionately to the number of times the task is divided into smaller and smaller pieces. Conceptually, this problem can be analogized to the size of a processing being represented by the volume of a 3D cube. Each time this volume is divided into smaller cubes, the total surface area of the cubes, which represents data that must be communicated between the processors working on sub-cubes, increases. Every time that the number of processors goes up by a factor of eight the total amount of information to be communicated between the greater number of processors doubles.

One reason for these problems caused by increasing parallelism is that most systems communicate by sending messages between processors, rather than sharing memory. This approach results in high latencies and high software overheads, although it may simplify some complex system architecture, operating system, and compiler issues. Unfortunately, as the level of parallelism increases, the processors in the system reach the point where all they are doing is managing message traffic rather than actually doing useful work.

There is therefore a need for a system and method that can reduce software overhead and eliminate or at least reduce performance bottlenecks thereby improving system performance and architectural scalability at relatively low cost.

DETAILED DESCRIPTION

Figure 1:
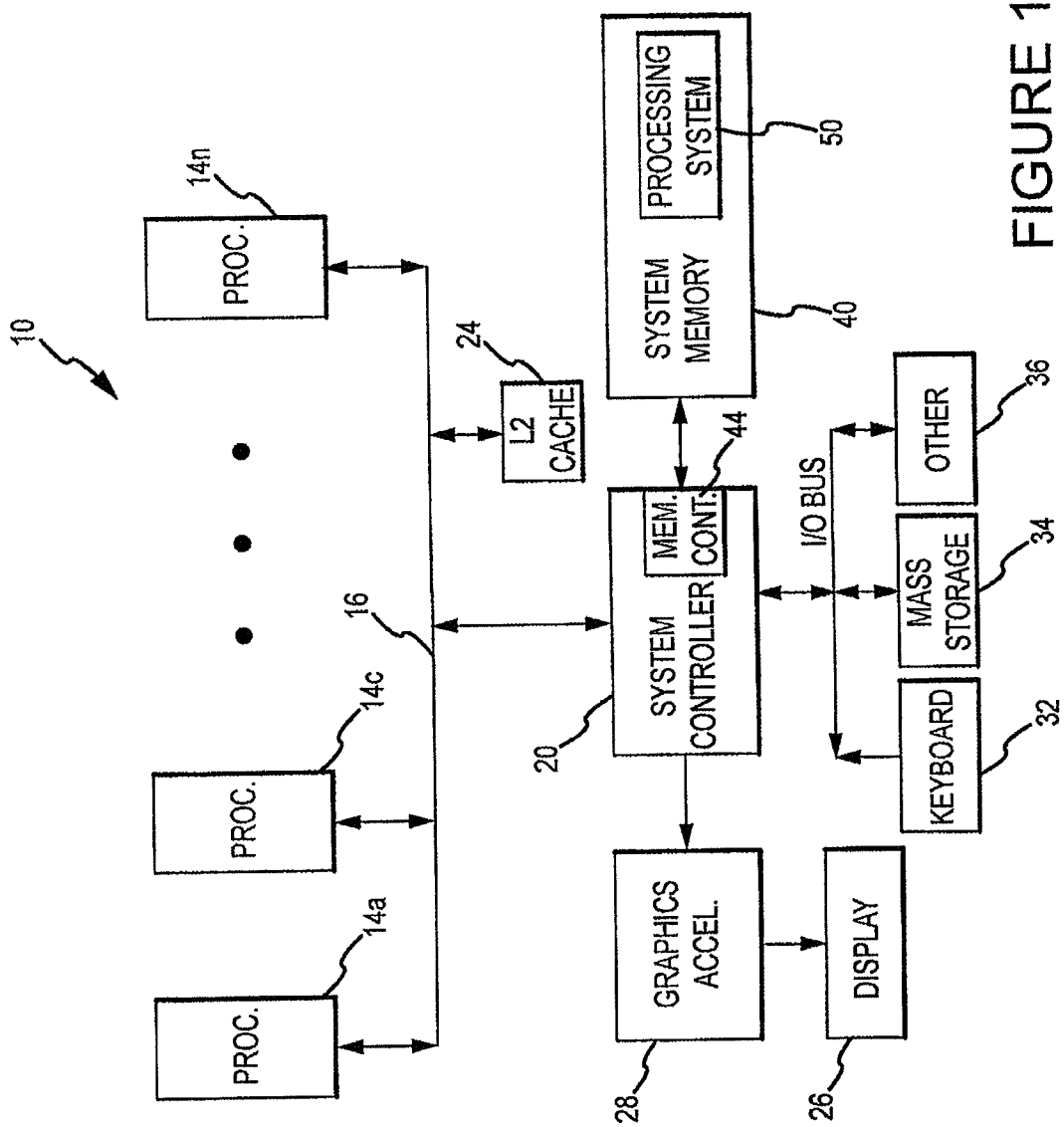
FIG. 1 is a block diagram of a computer system according to one embodiment.

A computer system 10 according to one embodiment is shown in FIG. 1. The computer system 10 includes several parallel processors $14_{1-N}$ connected to a common processor bus 16. Also connected to the processor bus 16 are a system controller 20 and a level 2 ("L2") cache 24. As is well known in the art, each of the processors $14_{1-N}$ may include a level 1 ("L1") cache.

The system controller 20 drives a display 26 through a graphics accelerator 28, which may include a graphics processor and graphics memory of conventional design. Also connected to the system controller 20 is an input/output ("I/O") bus 30, such as a peripheral component interconnect ("PCI") bus, to which are connected a keyboard 32, a mass storage device 34, such as a hard disk drive, and other peripheral devices 36. Of course there can also be systems such as servers that do not have directly connected keyboard, graphics or display capabilities, for example.

The computer system 10 also includes system memory 40, which may be a dynamic random access memory ("DRAM") device or sets of such devices. The system memory 40 is controlled by memory controller circuitry 44 in the system controller 20 through a memory bus 46, which normally includes a command/status bus, an address bus and a data bus. There are also systems in which the system and memory controller is implemented directly within a processor IC. As described so far, the computer system 10 is conventional. However, the system memory 40 departs from conventional systems by including in the system memory 40 a processing system 50 that enhancers the ability of the parallel processors $14_{1-N}$ to access the system memory 40 in an efficient manner. It should also be understood that the system 50 may be used in memory devices in a computer or other processor-based systems that differ from the computer system 10 shown in FIG. 1. For example, servers and other high-end systems will generally not include the graphics accelerator 28, the display 26, the keyboard 32, etc., but will have disk systems or simply connect to a network of other similar processors with attached memory.

The processing system 50 includes circuitry that allows the system memory 40 to be naturally coherent by carrying out operations in the memory device an indivisible manner. The system reduces or eliminates coherency issues and may improve communication for all levels in the computer system 10. The processing system 50 or a processing system according to some other embodiment can be implemented in the system memory 40 while keeping the internal organization of the memory system substantially the same as in conventional system memories. For example, bank timing and memory data rates can be substantially the same.

Further, the system 50 need not be particularly fast as the operations needed are generally simple and fit with current and anticipated memory clock rates.

In general, it is preferable for the processing to be initiated and to be performed as a single indivisible operation. An example is where a byte in a 32-bit word is updated (read and then written) while preventing access to the word while the update is being executed. Functions like these, which are sometime referred to as "atomic," are desired when parallel processes access and update shared data. The processing system 50 allows the system memory 40 to be naturally coherent by performing operations as an indivisible whole with a single access. The coherency circuitry reduces or eliminates coherency issues and may improve communication for all levels in the computer system 10. The coherency circuitry operates most advantageously when used with other extensions to the functionality of memory devices, such as that provided by a cache system.

Figure 2:
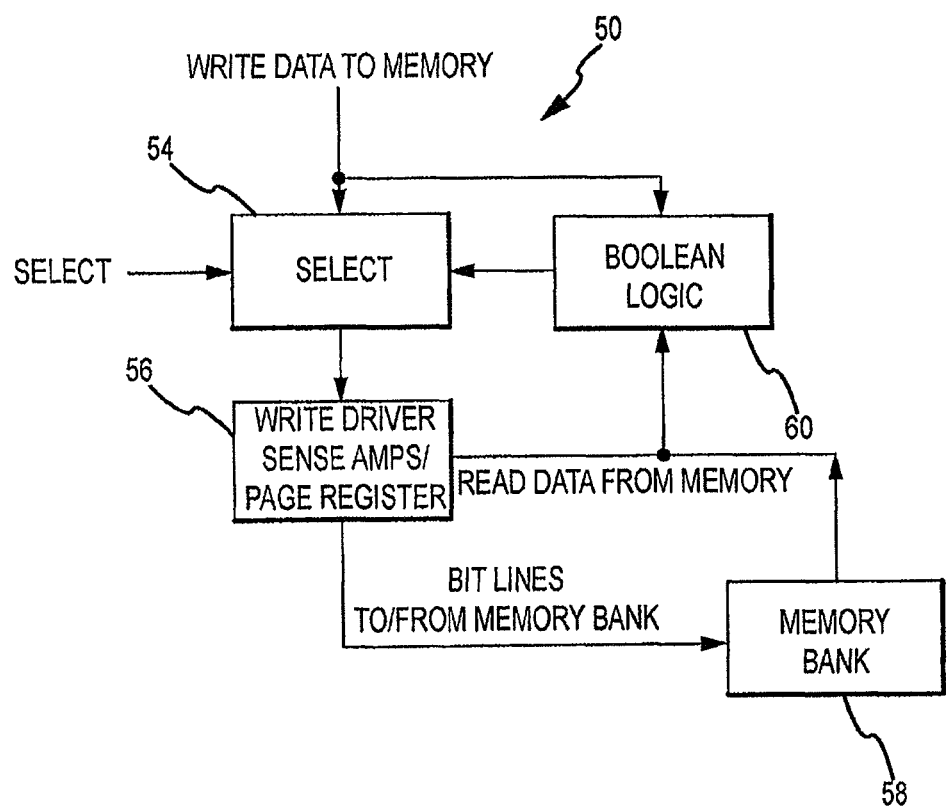
FIG. 2 is block diagram of a portion of a system memory device containing processing logic according to one embodiment that may be used in the computer system of FIG. 1 to allow operations to be carried out in the memory device in an indivisible manner.

One embodiment of a processing system 50 is shown in FIG. 2. The system 50 includes a select circuit 54, which may be a multiplexer, that routes write data to a column of a Memory Bank 58 through a set of write drivers 56. The write data are routed to the column from either a data bus of the memory device 40 or Boolean Logic 60. The Boolean Logic 60 receives read data from a set of sense amplifiers and page registers 56. The read data are also applied to the data bus of the memory device 40.

In operation, the select circuit 54 normally couples write data directly to the write drivers 56 of the Bank 58. However, in response to a command from the memory controller 44, the select circuit 54 routes data from the Boolean Logic 60 to the write drivers 56. In response to a read command, the read data are applied to the Boolean Logic 60, and the Boolean Logic 60 then performs a Boolean logic operation on the read data and writes data resulting from the operation back to the location in the Bank 58 where the data was read. If the memory device 40 includes a cache memory, the Boolean Logic 60 can instead perform an operation on data read from the cache memory before writing the result data back to the same location in the cache memory.

Although the system 50 shown in FIG. 2 uses Boolean Logic 60, other embodiments may use circuits or logic that perform other increased functions. In general, this increased functionality may be logic functions, such as AND, OR, etc. functions, arithmetic operations, such as ADD and SUB, and similar operations that can update and change the contents of memory. Arithmetic functions would be very useful to multiple different kinds of software. However, as indicated above, the system 150 performs Boolean logic operations since they are also very useful functions to implement as flags and for general communication between computation threads, cores, and clusters. A Boolean operation is a stand-alone bit-operation since no communication between bits participating in the operation is generally required, and can be implemented efficiently on a memory die. As each Boolean operation is simple, the logic implementing the functions does not have to be fast compared to the memory clock. These functions provide coherency directly as memory is modified in the memory device. These functions, in conjunction with the protection capability described previously, enable system implementation of a set of easy to use but novel memory functions.

Typical logical functions that may be implemented by the Boolean Logic 60 are shown in Table 1, below. The increased functionality can provide solutions to many of the issues that surround the increased parallelism of new computer implementations.

The basic operation that is performed to implement the logic functions is: WriteData .OP. MemData→MemData where ".OP." is a value designating a specified Boolean logic function. Memory data is modified by data contained in what is basically a Write operation, with the result returned to the same place in memory that sourced the data. An on-chip data cache can be source and/or sink of the data that is operated on by the Boolean Logic 160. If the data source is a memory bank rather than a cache memory, an Activate to a bank specified in the command should also be issued, with the page data loaded into the normal row buffer. Write data accompanying the command is then applied to the row buffer at the specified column addresses. The result is written back to memory, though this could be under control of a Precharge bit in the Boolean logic 60. The operation is thus a Write, but with memory data itself modifying what is written back to memory. If the data source is a cache memory, then a cache row is fetched, such as by using tag bits as described previously. After the data read from the cache memory is transformed by the logic operation, the result data are stored at the same location in the cache memory.

In operation, there may be multiple different kinds of OPs, so as to enable memory bits to be set, cleared and complemented. As detailed below, this write-up shows eight different operations. A particular set of command bits are not shown here to encode the particular Boolean logic function because the implementation can be independent of the cache memory operations described previously. If combined with the use of a cache memory, a cache reference command as described above may be used. This cache reference command may be encoded using a respective set of RAS, CAS, WE, DM command signals. A set of commands is shown in Table 1, below. The manner in which those command bits map to DRAM command bits my be defined in a variety of manners. However, one embodiment of a set of instructions and an instruction mapping is shown in Table 1 in which "W" designates a write bit received by the memory device, "M" designates a bit of data read from either a bank of memory cells or the cache memory, "·" is an AND function, "+" is an OR function, and "s" is an exclusive OR function.

Figure 3:
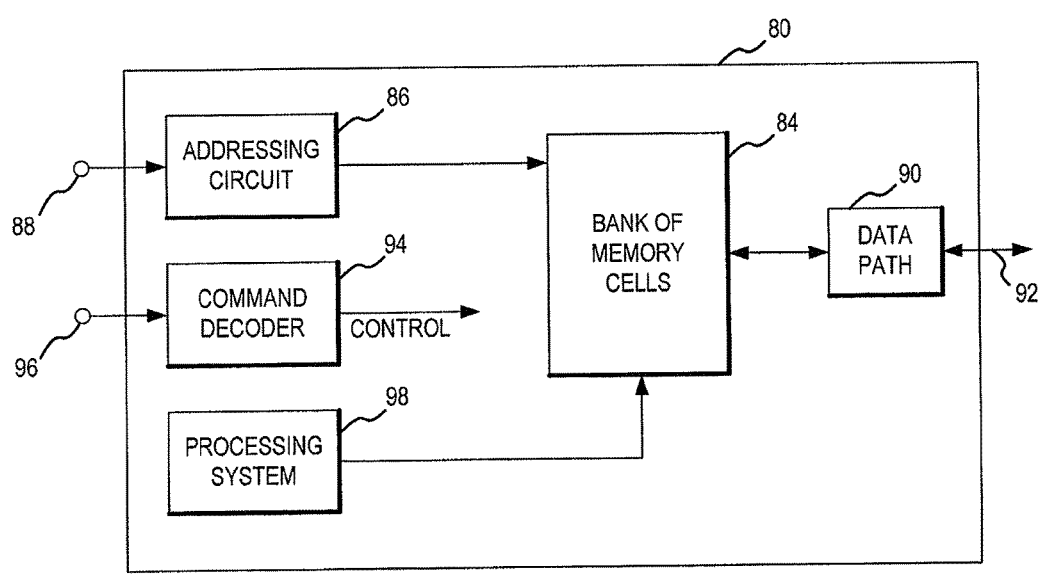
FIG. 3 is a block diagram of a memory device according to one embodiment that may be used in the computer system of FIG. 1.

FIG. 3 shows one embodiment of a memory device 80. The memory device 80 includes at least one bank of memory cells 84 coupled to an addressing circuit 86 that is coupled between external terminals 88 and the at least one bank of memory cells 84. The memory device 80 also includes a data path 90 coupled between 92 external terminals and the at least one bank of memory cells 84. Also included in the memory device 80 is a command decoder 94 coupled to external terminals 96. The command decoder 94 is operable to generate control signals to control the operation of the memory device 80. Finally, the memory device 80 includes a processing system 98 coupled to the at least one bank of memory cells 84. The processing system is operable to perform a processing function on data read from the at least one bank of memory cells 84 to provide results data and to write the results data to the at least one bank of memory cells 84. The processing system 50 shown in FIG. 2 may be used as the processing system 98, or some other embodiment of a processing system may be used as the processing system 98.

TABLE 2

Boolean Functions

| OP Code (octal) | Primary Equation | Alternate Equation | Common Name | Operation |
|---|---|---|---|---|
| 0 | W · M | | AND | Clear on 0's |
| 1 | $\overline{W}$ · M | | | Clear on 1's |
| 2 | W ⊕ M | | XOR | Complement on 1's |
| 3 | $\overline{W}$ · $\overline{M}$ | $\overline{W + M}$ | NOR | NOR |
| 4 | $\overline{W \cdot M}$ | $\overline{W}$ + $\overline{M}$ | NAND | NAND |
| 5 | $\overline{W \oplus M}$ | | EQV | Complement on 0's |
| 6 | $\overline{W}$ · M | W + M | | Set on 0's |
| 7 | $\overline{W \cdot M}$ | W + M | OR | Set on 1's |

Notes:
1 "W" is a write bit coming from the input pins.
2 "M" is a memory bit
3 "·" is AND
4 "+" is OR
5 "⊕" is Exclusive OR From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated circuit memory device comprising:
a plurality of memory cells;
a logic unit configured to perform a logic function on data initially received from a first location in the plurality of memory cells and output a result data responsive to the logic function;
a select circuit coupled to a plurality of terminals and the logic unit, the select circuit configured to receive write data via the plurality of terminals and the result data from the logic unit and to select between the plurality of terminals and the logic unit, based on a command; and
a write driver coupled to the select circuit and configured to receive one of the write data and the result data and, in response to receiving the result data, write the result data to the first location of the plurality of memory cells, wherein the result data replaces the data initially received from the first location.

2. The integrated circuit memory device as claimed in claim 1, wherein in response to a read command, the select circuit selects the logic unit.

3. The integrated circuit memory device as claimed in claim 2, wherein the read command is provided to the memory by an external component.

4. The integrated circuit memory device as claimed in claim 2, wherein when the plurality of terminals is configured to receive data to be written to the memory, the select circuit is configured to select the plurality of terminals in response.

5. The integrated circuit memory device as claimed in claim 1, wherein the logic function comprises an AND operation.

6. The integrated circuit memory device as claimed in claim 1, wherein the logic function comprises an OR function.

7. The integrated circuit memory device as claimed in claim 1, wherein the logic function comprises an arithmetic operation.

8. The integrated circuit memory device as claimed in claim 1, wherein the logic function comprises an XOR operation.

9. The integrated circuit memory device as claimed in claim 1, wherein the logic function comprises a NAND operation.

10. A method, comprising:
providing data read from a first location of a plurality of memory cells to a logic unit;
performing, by the logic unit, a logic function on the data initially read from the first location;
providing a result data of the logic function to a select circuit in response to the logic function performed on the data;
providing, with the select circuit, the result data of the logic function to a write driver responsive to a selection signal, wherein the selection signal is based on a command; and writing, by the write driver, the result data to the first location of the plurality of memory cells, wherein the result data replaces the data initially read from the first location,
wherein the memory cells, the logic unit, and the write driver are incorporated into an integrated circuit memory device.

11. The method as claimed in claim 10, wherein a cache memory is configured to load the data in the plurality of memory cells, and wherein providing data read from the plurality of memory cells to the logic unit comprises reading the data from the cache memory and wherein providing the result data of the logic function to the write driver comprises sending the result data to the cache memory.

12. The method as claimed in claim 10, wherein the logic function comprises an AND operation.

13. The method as claimed in claim 10, wherein the logic function comprises an OR operation.

14. The method as claimed in claim 10, wherein the logic function comprises an arithmetic operation.

15. The method as claimed in claim 10, wherein the logic function comprises an XOR operation.

16. The method as claimed in claim 10, wherein the logic function comprises a NAND operation.

17. A system comprising:
a controller and an integrated circuit memory device coupled to the controller, wherein the controller is configured to provide a command to the integrated circuit memory device and wherein the integrated circuit memory device is configured to receive write data from the controller;
the integrated circuit memory device comprising:
a plurality of memory cells;
a command decoder;
a logic unit configured to perform a logic function on data initially read from a first location in the plurality of memory cells in response to the command and output a result data of the logic function;
a select circuit configured to receive the write data and the result data and selectively provide the result data responsive to the command; and
a write driver configured to receive the result data and provide the result data to the plurality of memory cells to be stored at the first location in the plurality of memory cells, wherein the result data replaces the data initially read from the first location.

18. The system as claimed in claim 17, wherein the select circuit is configured to selectively couple a data path to the write driver to provide the write data on the data path to the write driver.

19. The system as claimed in claim 17, wherein the logic function comprises an AND operation.

20. The system as claimed in claim 17, wherein the logic function comprises an OR operation.

* * * * *